United States Patent [19]

Fosler, Jr. et al.

[11] 4,011,468
[45] Mar. 8, 1977

[54] LOW POWER CLOCK DRIVER

[75] Inventors: Dick E. Fosler, Jr.; Thomas L. Krocheski, both of Burnsville, Minn.

[73] Assignee: Sperry Rand Corporation, New York, N.Y.

[22] Filed: Oct. 1, 1975

[21] Appl. No.: 618,596

[52] U.S. Cl. .............................. 307/270; 307/208; 307/260; 328/61

[51] Int. Cl.² .................... H03K 1/00; H03K 3/26; H03K 4/00; H03K 5/01

[58] Field of Search .......... 307/208, 260, 265, 270; 328/59, 60, 61

[56] References Cited
UNITED STATES PATENTS

| | | | |
|---|---|---|---|
| 3,104,330 | 9/1963 | Hamilton | 307/208 |
| 3,233,113 | 2/1966 | Apple et al. | 307/270 |
| 3,523,197 | 8/1970 | Salzer | 307/270 |
| 3,662,191 | 5/1972 | Aley | 307/270 |
| 3,728,559 | 4/1973 | Spann et al. | 307/270 |
| 3,824,408 | 7/1974 | Brunel | 307/270 |
| 3,904,894 | 9/1975 | Ciolli | 307/260 |

*Primary Examiner*—Stanley D. Miller, Jr.
*Attorney, Agent, or Firm*—Thomas J. Nikolai; Kenneth T. Grace; Marshall M. Truex

[57] ABSTRACT

A low power dissipation circuit for generating clock pulses comprises a plurality of solid state devices which are normally off and draw only leakage current in their quiescent state. The clock pulse is started by a signal to a set side driver and is stopped by a signal to a reset side driver. The input drivers remain on only during the time they are being driven. The output drivers for generating the clock pulse comprises a pair of switching transistors which remain on only while the clock switching pulses are being generated.

12 Claims, 2 Drawing Figures

LOW POWER CLOCK DRIVER

BACKGROUND OF THE INVENTION

1. Field of the Invention

This invention relates to a switching circuit for generating clock pulses. More particularly, this invention relates to a novel fast acting switching circuit for generating clock pulses which has a fast rise time and a fast fall time and wherein the switching circuit is normally off and draws only leakage current between periodic clock pulses.

2. Description of the Prior Art

Bistable switching circuits which include flip-flops for generating clock pulses are well known. Heretofore, most bistable switching circuits which included flip-flops have maintained part of the circuit devices active at all times. While active solid state bistable circuits draw less power than other types of bistable circuits, they still require substantially more power in the on state than in the off state.

Dynamic semiconductor memory systems are well known and are commercially available as packaged modules which may be arranged in X, Y and Z memory planes to provide solid state memories for the largest and the fastest computers. One of the disadvantages with dynamic semiconductor memory systems is that the data stored in the volatile semiconductor memory will be lost when the power source fails if no back-up or alternate emergency power source is provided. Most back-up power sources comprise some form of batteries and the back-up power source is usually used to preserve and maintain the essential elements and function of the computer system until normal power is restored. One of the essential functions to be maintained is to maintain the dynamic semiconductor memory refreshed.

Heretofore, it was known that a dynamic semiconductor memory could be refreshed by periodically interrupting the normal read and write operations and supplying a refresh address signal on each of the address lines of the semiconductor memory matrix. It has been common practice to provide an independent and secondary refresh address driving circuit which is turned on at the time power failure is sensed. Heretofore, such refresh address power driving means and clock driving circuits have required a large amount of power to sustain or refresh the dynamic semiconductor memory.

SUMMARY OF THE INVENTION

The present invention provides a novel low power switching circuit for generating periodic clock pulses.

A principal object of the present invention is to provide a bistable switching circuit for generating clock pulses which draws only leakage current between periodic clock pulses.

Another object of the present invention is to provide means for generating clock pulses which includes a novel bistable flip-flop circuit.

Another object of the present invention is to provide a novel switching circuit for generating clock pulses which may be implemented with semiconductor devices having low power requirements.

Another object of the present invention is to provide a switching circuit for generating fast rise time and fast fall time clock pulses.

Yet another object of the present invention is to provide a circuit for disabling the switching circuit for generating clock pulses when the normal power source is switching to a reserve power source.

According to the above objects and principles of the present invention, there is provided a low power dissipation switching circuit for generating clock pulses comprising a plurality of solid state devices including a bistable clamp and output driving transistors which are in a normal off state and draw only leakage current in their quiescent state. The clock pulse is started and terminated by low power input driver devices cooperating with the bistable clamp and are maintained in their normally off state until pulsed. The bistable clamp comprises high speed and low power solid state devices which are normally off and maintain their active on condition until the switching circuit is returned in the off condition. The output driving transistors are normally off and are switched on only to generate the fast rise time and fall time clock switching pulse.

DESCRIPTION OF THE PREFERRED EMBODIMENT

Figure 1:
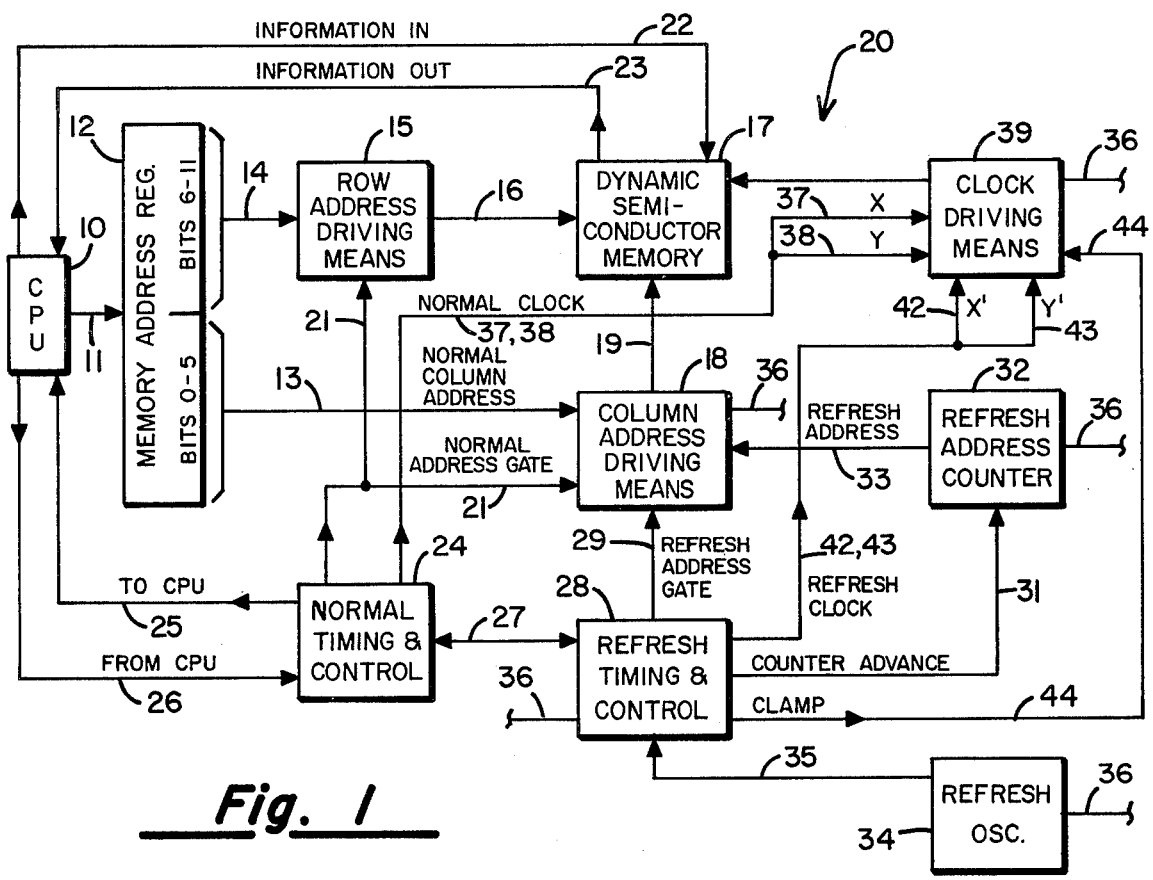
FIG. 1 is a block diagram of a typical dynamic semiconductor memory system in which the pesent invention clock driving circuit is embodied.

FIG. 1 is a block diagram showing the elements embodied in the present dynamic semiconductor memory 20. The solid state memory system 20 is of the type associated with high speed solid state computers. The computer (CPU) 10 is adapted to supply a 12 bit address on line 11 to the 12 bit buffer memory address register 12 where it is stored and employed to select an address in memory as will be explained. The first 6 bits (bits zero to five) of the address in register 12 define a column address on lines 13. The last 6 bits (bits six to twelve) define a row address on lines 14. The normal row address on lines 14 is gated and amplified in row address driving means 15 and the active signals from driving means 15 is supplied on lines 16 to define the row address to be accessed in the dynamic semiconductor memory matrix 17. The normal column address on lines 13 is gated and amplified in column address driving means 18 and the active signals from the plurality of column drivers which define a column address are transmitted on a plurality of driving lines 19 to the dynamic semiconductor memory matrix 17.

A typical random access solid state memory chip of the type preferably employed in the present memory 17 is made by Texas Instruments, Inc. and designated as a TMS4030JL, NL (4096 bit random access memory). This high speed dynamic 4096 bit MOS memory chip is organized as 4096 one bit words in a matrix of 64 rows and 64 columns. Twelve pins of the 22 pin dual inline package provide the pin access to the columns and rows. A word comprising a plurality of bits may be implemented by employing a plurality of such chips arranged in parallel so that the same bits in all of the chips are accessed by the same address drivers.

The TMS 4030 chip has only one clock (chip enable) input terminal which requires a single external clock input. The single low capacitance clock input requires a positive voltage swing of approximately 12 volts. The typical capacitance of the clock input to each chip is 18 to 23 picafarads and this capacitance is small enough to permit a plurality of such chips to be driven by a single external clock circuit as will be explained hereinafter.

Normal address gating signals on lines 21 enable the row address driving means 15 and the column address driving means 18. The address signals on lines 16 and 19 are connected to the address input pins of the memory 17 and are decoded inside the memory package to cause a single row and a single column to be selected.

When the column and row of the memory are properly selected, information can be read in (write) on read-in line 22 and can be read out (read) on read-out line 23. Reading and writing operations in which memory cells are accessed by column and row addresses cause the capacitor which is in the gate of the memory cell to be charged and refreshed.

The dynamic semiconductor memory system 20 includes normal timing and control circuits 24 which are controlled by CPU 10 via lines 25 and 26. The refresh timing and control circuits 28 generate refresh address gating signals on line 29 which enable the column address drivers in the column address driving means 18. The refresh timing and control circuits 28 are coordinated with the timing and control means 24 and the CPU via line 27. When the normal timing and control means 24 produce normal address gating signals on line 21, the refresh gating signals on line 29 are inhibited and when the refresh address gating signals on line 29 are produced by the refresh timing and control circuits 28, the normal address gating signals on line 21 are inhibited.

Whenever a read or write operation is occurring in the dynamic semiconductor memory system 20, the semiconductor devices associated with the columns being accessed are being refreshed during both the read and write operation. During normal access to the dynamic semiconductor memory matrix 17, it cannot be assured that every column and every transistor or cell in the columns will be read into or written out of during the critical time required for refreshing or recharging the capacitors in the gate of the transistors. Accordingly, it is necessary to generate refresh address signals which are similar to read and write operations on all of the columns on the dynamic semiconductor memory matrix 17 in order to refresh and recharge the capacitors in the base of the memory transistors.

The normal timing and control circuits 24 will continue normal read and write operations by generating normal address gating signals on line 21 and will not interrupt the normal read and write operations for a refresh operation. During a normal read or write operation when a refresh cycle is initiated, the next cycle which will occur will be a refresh generation cycle. The normal read and write operations are of extremely short duration and the refresh cycle can be initiated well before the critical time for refreshing and recharging. Every 32 microseconds the refresh oscillator 34 will be energized and produce a signal on line 35 which initiates a refresh cycle. The refresh timing and control circuits 28 generate a timing or counter advance signal on line 31 to the refresh address counter circuits 32. The refresh address counter circuits 32 generate the scanning or refresh address signals on line 33 which are indicative of one of the 64 column addresses. When permitted by the normal timing and control circuits 24 via line 27, the refresh timing and control circuits 28 will produce gating signals on line 29 and also permit counter advance timing signals on line 31 to activate the refresh address counter 32 and produce a refresh address on line 33 indicative of one of the 64 columns being refreshed.

In a volatile dynamic semiconductor memory system it is important to avoid the loss of stored data. Standby power means (not shown) via line 36 supplies power to the memory 17 and the associated circuits which supply the refresh address signals. Both the normal column address supplied on line 13 and the refresh column address supplied on line 33 are amplified and driven in column driving means 18 to produce a column address signal on lines 19. A detailed description of the column driving means 18 has been disclosed in "A Compatible Standby Power Driver for a Dynamic Semiconductor Memory", filed May 8, 1975 as U.S. Ser. No. 575,541.

The normal timing and control means 24 produce a pair of normal clock trigger pulses X and Y on lines 37, 38 which are shaped and amplified in clock driving means 39 to produce the output clock pulse signal on line 41. The X trigger pulse defines the time for starting the clock signal on line 41 and the Y trigger pulse defines the time for terminating the output clock pulse signal on line 41. When the memory system 20 loses power, the refresh timing and control circuits 28 continue to operate on standby power and will produce a pair of refresh clock trigger pulses X' and Y' on lines 42, 43 which are also amplified in clock driving means 39 and produce clock signals on line 41 as will be explained hereinafter. When normal power is lost and standby power is being switched on, there is a drop in voltage during the transition. During the transition period the refresh timing and control circuits 28 produce a clamp signal on line 44 which prevents the clock driving means 39 from attempting to produce a clock signal on line 41 until full standby power has been achieved.

Figure 2:
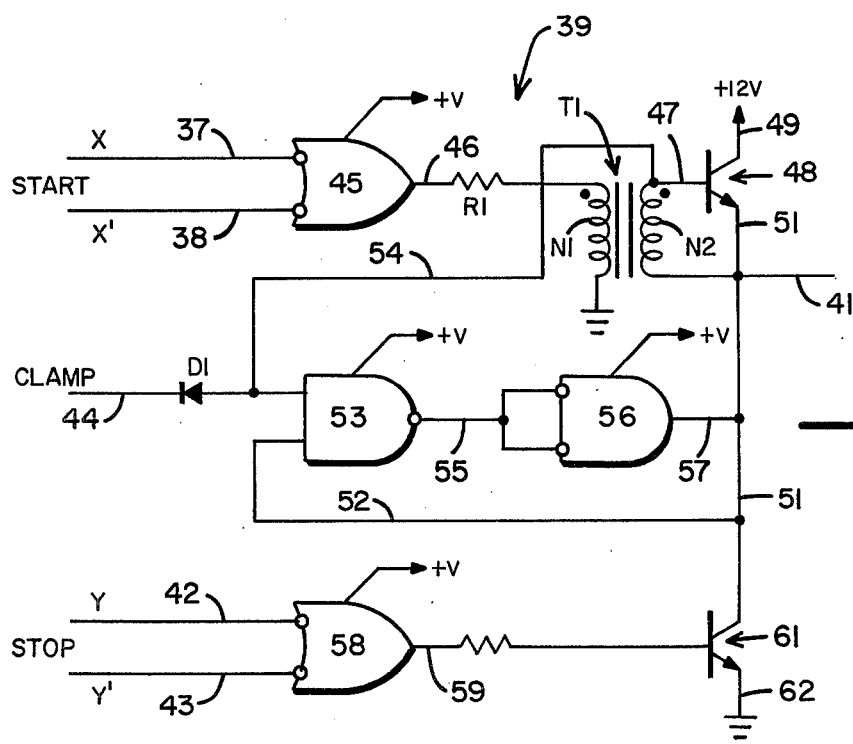
FIG. 2 is a schematic block diagram of the clock driving circuit embodying the present invention.

Refer now to FIG. 2 showing a preferred embodiment of the present invention clock driving circuit. As explained hereinbefore, the refresh oscillator 34 initiates a refresh cycle every 32 microseconds, and when a normal read or write operation does not delay the refresh cycle, the normal refresh timing and control circuits 24 produce a pair of low active X and Y trigger pulses on lines 37 and 42 which enables the column refresh signals to be strobed or clocked into the memory matrix 17.

A low active trigger pulse signal on line 37 to the normally off set side NAND gate 45 will produce a high active signal on output line 46 which is connected to ground through resistor R1 and the primary winding N1 of transformer T1 generates a high voltage signal at the base 47 of the normally off set side output driver transistor 48 sufficient to turn transistor 48 on. The collector 49 of the transistor 48 is connected to a 12 volt power source. When driver transistor 48 is switched on by the trigger pulse at the base 47, the emitter 51 rises to approximately 12 volts. The emitter 51 is connected to the output of clock driving means 39 via line 41 and through the secondary winding N2 of transformer T1 to the base 47 of transistor 48. The voltage on base 47 is not sufficient to hold transistor 48 in the conducting state after the starting trigger pulse X is terminated. The duration of the output clock pulse on line 41 which enables the dynamic semiconductor memory 17 is approximately 300 microseconds. The starting and stopping pulses X and Y are preferably limited to 75 nanoseconds duration. The output driver switching transistor 48 is preferably and NPN bipolar device such as ZN3647 made by Texas Instruments, Inc. and having a rise and fall time below fifty nanoseconds.

The high active signal on emitter output line 51 is connected via line 52 to the input of inverting AND gate 53. The high active signal on line 47, and the base of transistor 48, is also connected to a second input of AND gate 53 via line 54. If the signal on clamp line 44 is high, indicating that no transition from normal power to standby power is taking place, AND gate 53 will conduct. When normal power or standby power is in its high active state, the clamp line 44 is high and diode D1 blocks the high signal permitting AND gate 53 to generate a low active output at line 55. The low active output on line 55 is inverted at inverting AND gate 56 to provide a high active signal on line 57. AND gates 53, 56 comprise a bistable clamp for locking the clock driving means 39 in a set state creating a high voltage output on lines 51 and 41.

Approximately 300 nanoseconds after the leading edge of the X trigger starting pulse, the low active Y trigger stopping pulse is applied on line 42 at NAND gate 58. The high active output on line 59 from NAND gate 58 is connected to the base of the reset side of output driving transistor 61 and is sufficiently high above ground to cause transistor 61 to conduct. When transistor 61 conducts the emitter 62, which is connected to ground, pulls lines 51 and 52 low. The low active signal on line 52 cuts off AND gates 53 and 56 generating a low active signal on line 57. After the short duration Y trigger pulse has terminated, all of the aforementioned solid state devices have been returned to their normally off state. The input drivers 45, 58 and the output drivers 48, 61 remain on only during the duration of the starting and stopping pulses. The bistable clamping means comprising AND gates 53 and 56 are on only during the duration of the output clock pulse on line 41. The normally off set side output driving transistor 48 is only on during the generation of input trigger starting clock pulses X or X' on line 46. The normally off reset side output driving transistor 61 is only on during the duration of the input trigger stopping pulses Y or Y' on line 59.

The clock driving means 39 is designed to drive multiple MOS RAM solid state memory devices totally a maximum of 1000 picafarads, thus, the aforementioned novel clock driving circuit is capable of driving up to 50 single chip large scale integrated circuit memory devices.

The refresh timing and control circuits 28 as explained hereinbefore will generate low active starting and stopping trigger pulses X' and Y' which operate in the same manner as the normal starting and stopping trigger pulses X, Y. NAND gates 45 and 58 and AND gates 53 and 56 are preferably 7400 series CMOS devices operated from +12 volts. The normal condition of such devices has virtually no current drain.

Having explained a preferred embodiment clock driving circuit 39 in the environment of a solid state dynamic semiconductor memory system 20, it will be understood that the low power switching circuit is operable as a novel flip-flop and may be embodied into other systems where low standby power flip-flops are required. By providing a high voltage on collector 49 of transistor 48, transformer T1 may be eliminated. Such modification is recommended when isolation is not required and appropriate d. c. voltage sources are available.

We claim:
1. A low power dissipation clock circuit comprising:
a normally off set side input driver for receiving clock pulse starting signals,
a normally off set side output driver having an input coupled to said set side input driver and an output connected to an output of clock pulses,
a normally off reset side input driver for receiving clock stopping signals,
a normally off reset side output driver having an input coupled to said reset side input driver and an output connected to said output of clock pulses, and
normally off bistable clamping means comprising at least two inputs and at least one output, one of said inputs and said output being connected to said output of clock pulses, and one of said inputs being connected to the input of said normally off set side output driver.

2. A low power dissipation clock circuit as set forth in claim 1 which further includes a transformer having a primary winding connected to the output of said set side input driver and a secondary winding connected across the input and the output of said set side output driver.

3. A low power dissipation clock circuit as set forth in claim 1 wherein said output drivers comprise switching transistors for starting and stopping said output clock pulses, said set side output driver being switched on at the start of said output clock pulses and said reset side output driver being switched on at the termination of said output clock pulses.

4. A low power dissipation clock circuit as set forth in claim 1 wherein said bistable clamping means comprises a normally off flip-flop which is switched on during the duration of said output clock pulses.

5. A low power dissipation clock circuit as set forth in claim 4 wherein said flip-flop comprises AND gates connected in series.

6. A low power dissipation clock circuit as set forth in claim 5 wherein one of said AND gates of said flip-flop is connected as a simple inverter.

7. A low power dissipation clock circuit as set forth in claim 1 wherein said set side driver, said reset side driver and said bistable clamping means comprise a plurality of AND gates.

8. A low power dissipation clock circuit as set forth in claim 2 wherein said set side driver and said reset side driver and said bistable clamping means comprise a plurality of CMOS low power AND gate devices and said switching transistors comprise bipolar MOS devices.

9. A low power dissipation circuit comprising:
a normally off set side input driver for receiving one of a plurality of starting pulses,
a normally off reset side input driver for receiving one of a plurality of stopping pulses,
normally off bistable clamping means coupled to said input drivers for clamping said circuit in an on or an off state, and
normally off output driver means connected to said input drivers and said clamping means for being turned on by one of said plurality of said starting pulses and to be turned off a predetermined time later by one of said plurality of said stopping pulses.

10. A low power dissipation clock circuit as set forth in claim 9 wherein said drivers and said bistable clamping means comprise solid state devices which are normally off in their quiescent state and wherein the only current flow is the leakage in the normally off solid state devices.

11. A low power dissipation clock circuit as set forth in claim 9 wherein said normally off bistable clamping means comprises at least two inputs and at least one output, one of said inputs of said bistable clamping means comprising a power on detection device.

12. A low power dissipation clock circuit as set forth in claim 11 wherein said power on detection device comprises a lead having a diode in series with a power source for driving one of said inputs to said bistable clamping means to a low inactive state which disables the bistable clamping means.

* * * * *

UNITED STATES PATENT AND TRADEMARK OFFICE
CERTIFICATE OF CORRECTION

PATENT NO. : 4,011,468
DATED : March 8, 1977
INVENTOR(S) : Dick E. Fosler, Jr. and Thomas L. Krocheski It is certified that error appears in the above-identified patent and that said Letters Patent are hereby corrected as shown below:

IN THE PRINTED PATENT

Column 6, Line 38: "comprises AND" should be -- comprises inverting AND --.

Column 6, Line 41: "said AND" should be -- said inverting AND --.

Column 6, Line 46: "AND" should be -- NAND --.

Column 6, Line 50: "AND" should be -- NAND --.

Signed and Sealed this

Tenth Day of May 1977

[SEAL]

Attest:

RUTH C. MASON
*Attesting Officer*

C. MARSHALL DANN
*Commissioner of Patents and Trademarks*